US010862066B2

(12) United States Patent
Zhai et al.

(10) Patent No.: US 10,862,066 B2
(45) Date of Patent: Dec. 8, 2020

(54) DISPLAY PANEL AND DISPLAY APPARATUS (71) Applicant: SHANGHAI TIANMA MICRO-ELECTRONICS CO., LTD., Shanghai (CN)

(72) Inventors: Yingteng Zhai, Shanghai (CN); Chuanli Leng, Shanghai (CN); Wenxin Jiang, Shanghai (CN); Gang Liu, Shanghai (CN)

(73) Assignee: SHANGHAI TIANMA MICRO-ELECTRONICS CO., LTD., Shanghai (CN)

(*) Notice: Subject to any disclaimer, the term of this patent is extended or adjusted under 35 U.S.C. 154(b) by 0 days.

(21) Appl. No.: 16/169,193

(22) Filed: Oct. 24, 2018

(65) Prior Publication Data
US 2020/0028114 A1 Jan. 23, 2020

(30) Foreign Application Priority Data
Jul. 19, 2018 (CN) .......................... 2018 1 0796072

(51) Int. Cl.
H01L 51/52 (2006.01)
G06F 3/044 (2006.01)
G09F 9/30 (2006.01)
H01L 27/32 (2006.01)
H01L 51/00 (2006.01)
(Continued)

(52) U.S. Cl.
CPC .......... H01L 51/5246 (2013.01); G06F 3/044 (2013.01); G09F 9/301 (2013.01); H01L 27/323 (2013.01); H01L 27/3244 (2013.01); H01L 51/0097 (2013.01); H01L 51/5203 (2013.01); H01L 51/5253 (2013.01); H01L 51/56 (2013.01); H05K 1/189 (2013.01)

(58) Field of Classification Search
CPC .......................... H01L 51/0097; H01L 51/525
See application file for complete search history.

(56) References Cited

U.S. PATENT DOCUMENTS

2015/0146386 A1* 5/2015 Namkung ............... H05K 1/028
361/749
2015/0313004 A1* 10/2015 Namkung ......... G02F 1/133308
361/749
(Continued)

FOREIGN PATENT DOCUMENTS

| CN | 101604675 A | 12/2009 |
| CN | 107331795 A | 11/2017 |
| CN | 107799550 A | 3/2018 |

Primary Examiner — Sepehr Azari
(74) Attorney, Agent, or Firm — Anova Law Group PLLC (57) ABSTRACT A display panel and a display apparatus are provided. An exemplary display panel includes a flexible display substrate; and a protective member covering a surface of the flexible display substrate. The protective member includes a first protective layer and a protective sealant; and a sidewall surface of the first protective layer adjacent to the protective sealant includes at least one first groove member. The first protective sealant and the first groove member clutch with each other; the display panel includes a first non-folding region and a folding region; the first protective layer is disposed in the first non-folding region; and the protective sealant is disposed in the folding region.

16 Claims, 9 Drawing Sheets (51) Int. Cl.
*H01L 51/56* (2006.01)
*H05K 1/18* (2006.01)

(56) References Cited

U.S. PATENT DOCUMENTS

| 2016/0172623 | A1* | 6/2016 | Lee | H01L 51/5253 |
| | | | | 257/40 |
| 2018/0083211 | A1* | 3/2018 | Lee | H01L 27/3258 |
| 2019/0165310 | A1* | 5/2019 | Kinjo | H01L 51/5253 |
| 2019/0213925 | A1* | 7/2019 | Ha | G06F 3/0412 |
| 2019/0245157 | A1* | 8/2019 | Chung | H01L 27/3276 |

\* cited by examiner

DISPLAY PANEL AND DISPLAY APPARATUS

CROSS-REFERENCES TO RELATED APPLICATIONS

This application claims priority of Chinese Patent Application No. 201810796072.X, filed on Jul. 19, 2018, the entire contents of which are hereby incorporated by reference.

FIELD OF THE DISCLOSURE

The present disclosure generally relates to the field of display technology and, more particularly, relates to a display panel and a display apparatus.

BACKGROUND

In human sensory organs, the visual organs (eyes) receive the most information. In both work and daily life, people need to use more and more abundant visual information. Thus, display technologies play a very important role in today's human society. Since their emergence, the display technologies have been developed very rapidly, including sequentially: the cathode ray tube technology (CRT), the plasma display (PDP), the liquid crystal display (LCD), and the latest organic light-emitting (OLED) display, and micro-diode (micro LED) display technology, etc.

With the continuous development of society and the increasing demand for material life, the current display technologies are being developed towards narrow frame, high contrast, high resolution, full color display, low power consumption, high reliability, long life, and thin and light-weighted. The research of the flexible display (soft screen) technology has also been constantly improved. Unlike the traditional flat panel display, when a flexible material is used as the substrate of the display panel, the flexible display is achieved; and thereby a fantastic visual effect is created. The flexible display panel can achieve multi-domain applications with their bendability, such as rollable display devices, flexible wearable devices, foldable displays, and the like. However, the reliability of the flexible displays is often not desirable. The disclosed display panel and display apparatus are directed to solve one or more problems set forth above and other problems in the art.

BRIEF SUMMARY OF THE DISCLOSURE

One aspect of the present disclosure provides a display panel. The display panel includes a flexible display substrate; and a protective member covering a surface of the flexible display substrate. The protective member includes a first protective layer and a protective sealant; and a sidewall surface of the first protective layer adjacent to the protective sealant includes at least one first groove member. The first protective sealant and the first groove member clutch with each other; the display panel includes a first non-folding region and a folding region; the first protective layer is disposed in the first non-folding region; and the protective sealant is disposed in the folding region.

Another aspect of the present disclosure provides a display apparatus. The display apparatus includes a display panel. The display panel includes a flexible display substrate; and a protective member covering a surface of the flexible display substrate. The protective member includes a first protective layer and a protective sealant; and a sidewall surface of the first protective layer adjacent to the protective sealant includes at least one first groove member. The protective sealant and the first groove member clutch with each other; the display panel includes a first non-folding region and a folding region; the first protective layer is disposed in the first non-folding region; and the protective sealant is disposed in the folding region.

Other aspects of the present disclosure can be understood by those skilled in the art in light of the description, the claims, and the drawings of the present disclosure.

BRIEF DESCRIPTION OF THE DRAWINGS

The following drawings are incorporated in and constitute a part of the specification, illustrate embodiments of the disclosure and, together with the detailed description, serve to explain the mechanism of the present disclosure.

DETAILED DESCRIPTION

Reference will now be made in detail to exemplary embodiments of the disclosure, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all the embodiments of the present disclosure. Based on the disclosed embodiments, persons of ordinary skill in the art may derive other embodiments consistent with the present disclosure, all of which are within the scope of the present disclosure. Further, in the present disclosure, the disclosed embodiments and the features of the disclosed embodiments may be combined when there are no conflicts.

Certain techniques, methods and apparatus that are understandable to the persons of ordinary skill in the art may not be described in detail. However, under appropriate conditions, such techniques, methods and apparatus are also included as the parts of the description.

In the disclosed embodiments, the specific values may be explained for illustrative purposes only and should not be used as limitations. Thus, embodiments may have different specific values.

Further, the similar symbols and letters in the drawings denote similar elements. Thus, once one element is defined in one drawing, it may not need to be defined in the following drawings.

The present disclosure provides a display apparatus and a display apparatus with improved reliability.

Figure 1:
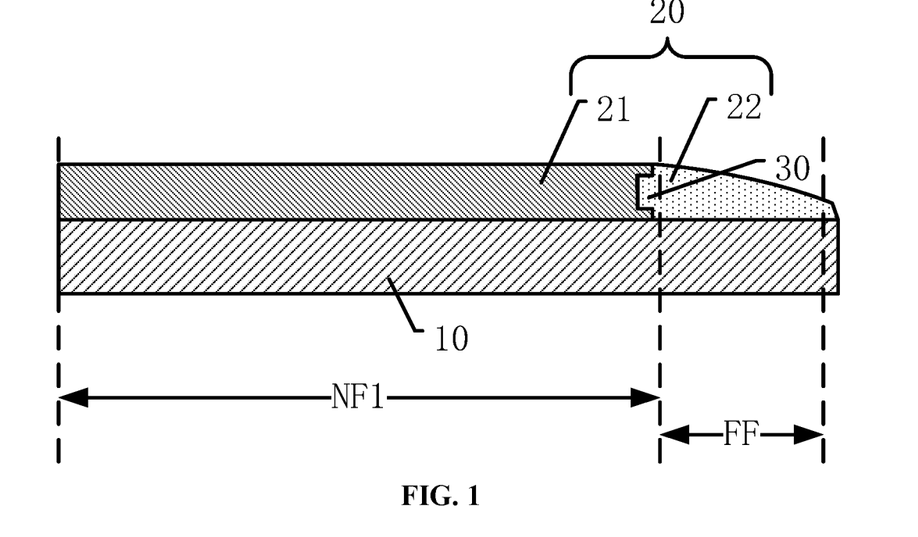
FIG. 1 illustrates an exemplary display panel consistent with various disclosed embodiments.
Figure 2:
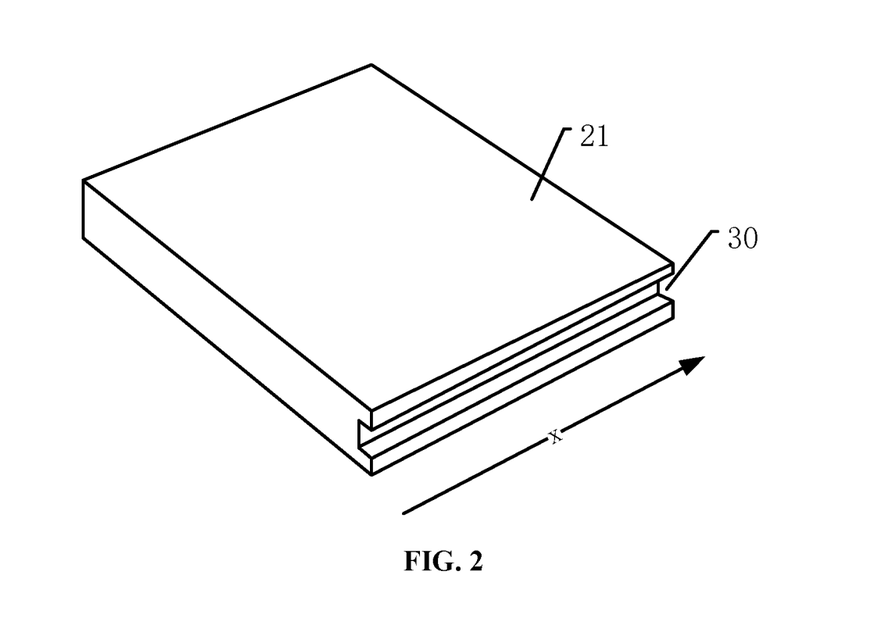
FIG. 2 illustrates a three-dimensional view of a first protective layer of the display panel in FIG. 1 consistent with various disclosed embodiments.

FIGS. 1-2 illustrate an exemplary display panel consistent with various disclosed embodiments. FIG. 2 illustrates a three-dimensional view of a protective layer of an exemplary display panel is FIG. 1.

As shown in FIGS. 1-2, the display panel may include a flexible display substrate 10 and a protective member 20. The protective member 20 may cover a surface of the flexible display substrate 10.

The protective member 20 may include a first protective layer 21 and a protective sealant 22. A side of the first protective layer adjacent to the protective sealant 22 may have a first groove member 30. The protective sealant 22 and the first groove member 30 may clutch with each other.

The display panel may include a first non-folding region NF1 and a folding region FF. The first protective layer 21 may be in the first non-folding region NF1 and the protective sealant 22 may be in the folding region FF.

In one embodiment, the flexible substrate 10 is made of a flexible and foldable material. Thus, the display panel may be foldable and bendable.

The flexible display substrate 10 may use a liquid crystal display (LCD) technology, an organic light-emitting display (OLED) technology, or an electronic paper display technology, etc. The display technology used in the flexible display substrate 10 and the specific structure thereof are not specifically limited by the present disclosure.

The protective member 20 may protect the flexible display substrate 10. In particular, the protective member 20 may have a certain degree of the stiffness and flexibility, when an external force impacts the display panel, the protective member 20 may protect the flexible display substrate 10. For example, the protective member 20 may have an air barrier function; and prevent the flexible display substrate 10 from being eroded by water vapor and/or oxygen; and prevent contaminations from entering the flexible display substrate 10.

The protective member 20 may include the first protective layer 21 and the protective sealant 22. The first protective layer 21 may be a flat panel structure. After being formed, the first protective layer 21 may be attached to the flexible display substrate 10. The protective sealant 22 may be coated on a pre-determined region of the flexible display substrate 10. After being cured, the protective sealant 20 may still have a desired flexibility.

The display panel may have a first non-folding region NF1 and a folding region FF. The first non-folding region NF1 may not have the foldable and bendable function; and may be the flat panel structure of the display panel. The folding region FF may have the foldable and bendable function. In one embodiment, when the display panel is applied to the terminal display apparatus, the display panel in the folding region FF may be at the folded and bended state.

The flexible display substrate 10 in the first non-folding region NF1 may be covered by the first protective layer 21; and the flexible display substrate 10 in the folding region FF may be covered by the protective sealant 22. Because the display panel in the folding region FF may be at the folded and bended state when the display panel is applied in a terminal display apparatus and the protective sealant 22 may have a desired toughness, the first protective member 20 may have a sufficient bonding with the flexible display substrate 10 to protect the display panel.

When the display panel in the folding region FF is bended and folded, to prevent a separation at the position where the first protective layer 21 and the protective sealant 22 are connected under a stress and the corresponding cracks in the protective member 20, in one embodiment, a first groove member 30 may be formed in the sidewall surface of the first protective layer 21 adjacent to the protective sealant 22. During process for coating the protective sealant 22, the protective sealant material may flow into the first groove member 30 and clutch with the first groove member 30 due to the liquidity of the protective sealant material. The first groove member 30 may increase the contact area between the protective sealant 22 and the first protective layer 21. The bonding between the protective sealant the first protective layer 21 may be increased. When the folding region FF of the display panel is folded, the separation at the position where he first protective layer 21 and the protectives sealant 22 are connected may be prevented; and the failure of the protective member 20 may be prevented. Accordingly, the reliability of the display panel may be improved.

In the disclosed display panel, the cross-section of the first groove member may have a plurality of different shapes, such as anyone of arc, "V" shape, "⌐" shape, and zigzag shape, etc. The cross-section of the first groove member is perpendicular to the length direction of the first groove member.

Figure 3:
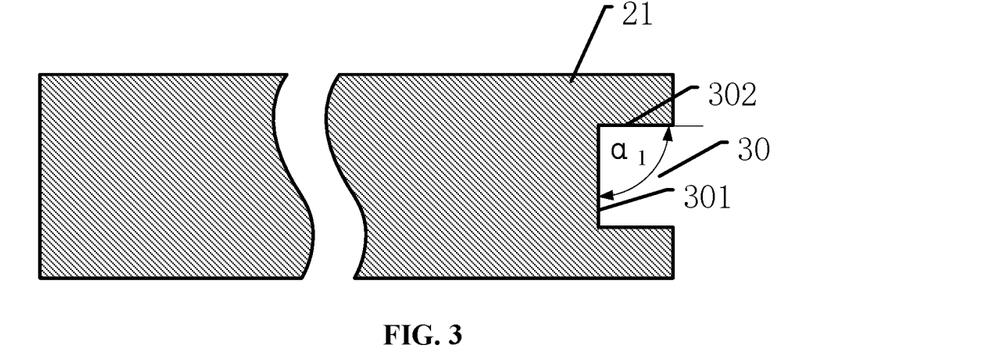
FIG. 3 illustrates a cross-sectional view of the first protective layer of the display panel in FIG. 1 consistent with various disclosed embodiments.

FIG. 3 illustrates a cross-sectional view of the first protective layer 21 of the display panel in FIG. 1. As shown in FIGS. 1-3, the cross-section of the first groove member 30 is ⌐-shaped. As shown in FIG. 2, the first groove member 30 may extend along the x-direction, i.e., the length direction of the first groove member 30 is the x-direction. As shown in FIG. 3, the cross-section of first groove member 30 may be perpendicular to the x-direction. In one embodiment, an angle α1 between a bottom 301 of the first groove member 30 and a sidewall surface 302 of the first groove member 30 may be a right angle. For the present disclosed display panel, during the coating process of the protective sealant 22, the protective sealant material may flow into the first groove member 30 and clutch with first groove member 30 due to its own liquidity. The first groove member 30 may increase the contact area between the protective sealant 22 and the first protective layer 21; and the bonding between the protective sealant 22 and the first protective layer 21 may be increased. When the folding region FF of the display panel is folded, the separation between the first protective layer 21 and the protective sealant 22 caused by a stress may be prevented. Accordingly, the failure of the protective member 20 may be prevented; and the reliability of the display panel may be improved.

Figure 4:
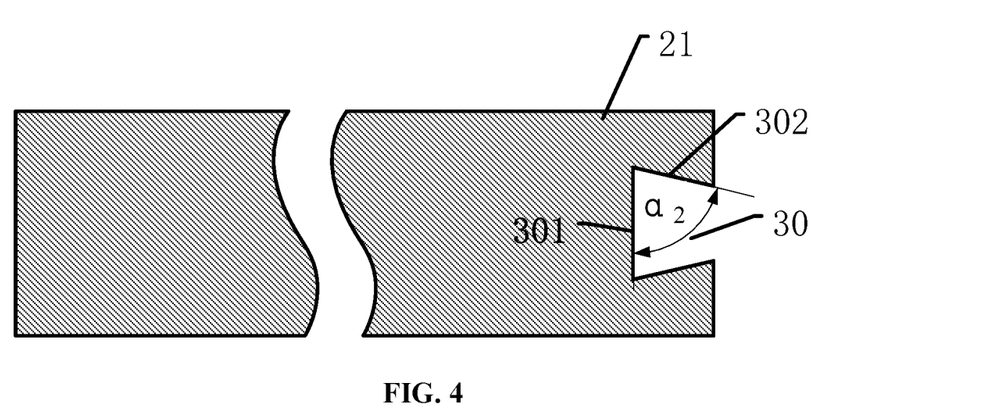
FIG. 4 illustrates a cross-sectional view of a first protective layer of another exemplary display panel consistent with various disclosed embodiments.

FIG. 4 illustrates a cross-sectional view of the first protective layer of another exemplary display panel consistent with various disclosed embodiment. As shown in FIG. 4, the cross-sectional view of the first groove member 30 is ⌐-shaped. The cross-section of the first groove member 30 illustrated in FIG. 4 is perpendicular to the length direction of the first groove member 30. An angle α2 between a bottom 301 of the first groove member 30 and a sidewall surface 302 of the first groove member 30 may be an acute angle.

For the present disclosed display panel, during the coating process for forming the protective sealant 22, the protective sealant material may flow into the first groove member 30 and clutch with first groove member 30 due to its own liquidity. Because the angle α2 between the bottom 301 of the first groove member 30 and the sidewall surface 302 of the first groove member 30 may be an acute angle, the contact area between the protective sealant 22 and the first protective layer 21 may be further increased. Thus, the bonding between the protective sealant 22 and the first protective layer 21 may be increased. When the folding region FF of the display panel is folded, the separation between the first protective layer 21 and the protective sealant 22 caused by a stress may be prevented. Accordingly, the failure of the protective member 20 may be prevented; and the reliability of the display panel may be improved.

Figure 5:
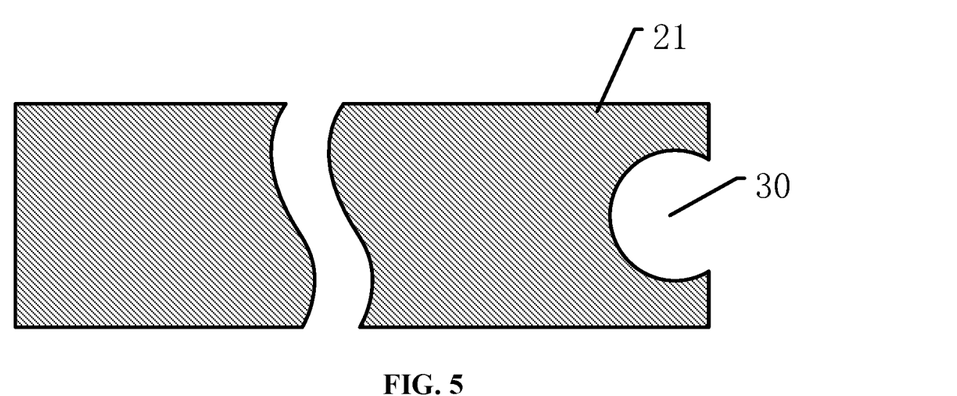
FIG. 5 illustrates a cross-sectional view of a first protective layer of another exemplary display panel consistent with various disclosed embodiments.

FIG. 5 illustrates a cross-sectional view of the first protective layer of another exemplary display panel consistent with various disclosed embodiments. As shown in FIG. 5, the cross-sectional view of the first groove member 30 is arc-shaped. The cross-section of the first groove member 30 illustrated in FIG. 5 is perpendicular to the length direction of the first groove member 30. In the present disclosed display panel, it may be substantially easy to form the first groove member 30 with the arc-shaped cross-section.

Further, during the flow of the protective sealant material, it may be easier for the protective sealant material to have an increased bonding with the first groove member 30 with the arc-shaped cross-section; and the contact area between the protective sealant 22 and the first protective layer 21 may be further increased. Thus, the bonding between the protective sealant 22 and the first protective layer 21 may be increased. When the folding region FF of the display panel is folded, the separation between the first protective layer 21 and the protective sealant 22 caused by a stress may be prevented. Accordingly, the failure of the protective member 20 may be prevented; and the reliability of the display panel may be improved.

Figure 6:
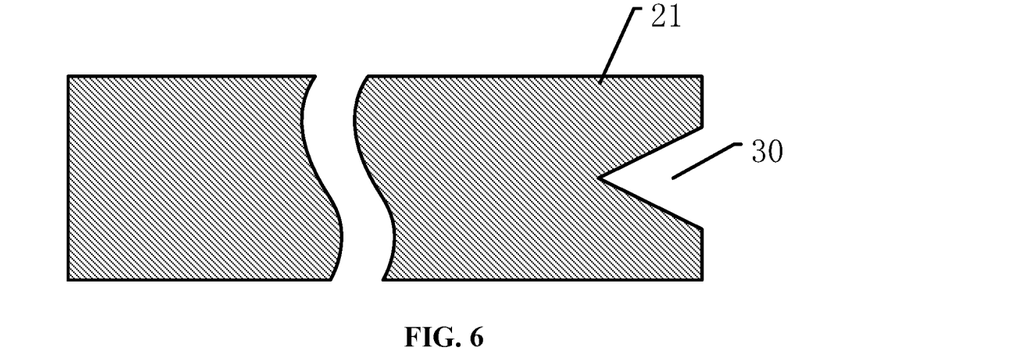
FIG. 6 illustrates a cross-sectional view of a first protective layer of another exemplary display panel consistent with various disclosed embodiments.

FIG. 6 illustrates a cross-sectional view of the first protective layer of another exemplary display panel consistent with various disclosed embodiments. As shown in FIG. 6, the cross-sectional view of the first groove member 30 is V-shaped. The cross-section of the first groove member 30 illustrated in FIG. 6 is perpendicular to the length direction of the first groove member 30. In the present disclosed display panel, it may be substantially easy to form the first groove member 30 with the V-shaped cross-section.

Further, during the process for coating the protective sealant material, the protective sealant material may flow into the first groove member 30 and clutch with the first groove member 30. The first groove member 30 may increase the contact area between the protective sealant 22 and the first protective layer 21. Thus, the bonding between the protective sealant 22 and the first protective layer 21 may be increased. When the folding region FF of the display panel is folded, the separation between the first protective layer 21 and the protective sealant 22 caused by a stress may be prevented. Accordingly, the failure of the protective member 20 may be prevented; and the reliability of the display panel may be improved.

Figure 7:
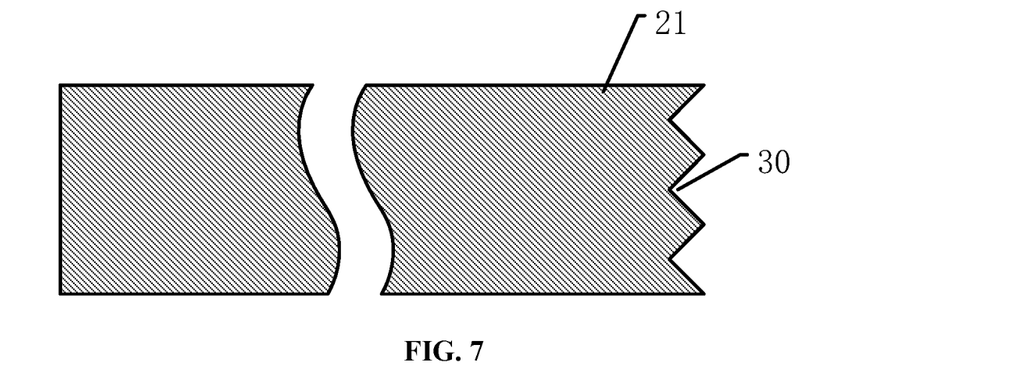
FIG. 7 illustrates a cross-sectional view of a first protective layer of another exemplary display panel consistent with various disclosed embodiments.

FIG. 7 illustrates a cross-sectional view of the first protective layer of another exemplary display panel consistent with various disclosed embodiments. As shown in FIG. 7, the cross-sectional view of the first groove member 30 is zigzag-shaped. The cross-section of the first groove member 30 illustrated in FIG. 7 is perpendicular to the length direction of the first groove member 30. In the present disclosed display panel, the cross-section of the first groove member 30 may be formed as the zigzag-shaped, the contact area between the protective sealant 22 and the first protective layer 21 may be further increased. Thus, the bonding strength between the protective sealant 22 and the first protective layer 21 may be increased. When the folding region FF of the display panel is folded, the zigzag-shaped structure may effectively increase the fraction force between the protective layer 21 and the protective sealant 22. Thus, the separation between the first protective layer 21 and the protective sealant 22 caused by a stress may be prevented. Accordingly, the failure of the protective member 20 may be prevented; and the reliability of the display panel may be improved.

Figure 8:
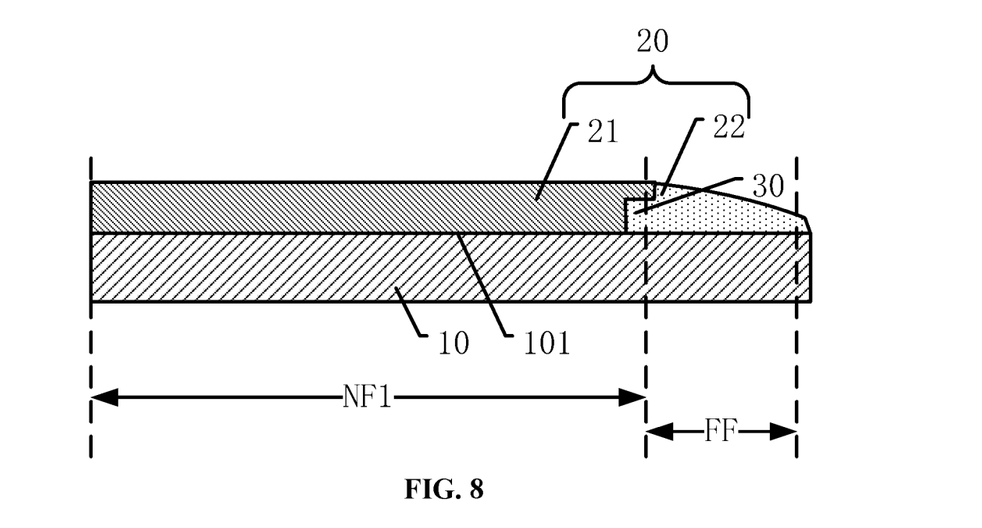
FIG. 8 illustrates another exemplary display panel consistent with various disclosed embodiments.

FIG. 8 illustrates another exemplary display panel consistent with various disclosed embodiments. As shown in FIG. 8, the display panel may include a flexible display substrate 10 and a protective member 20. The protective member 20 may cover a first surface 101 of the flexible display substrate 10.

The protective member 20 may include a first protective layer 21 and a protective sealant 22. A sidewall surface of the first protective layer 21 adjacent to the protective sealant 22 may have a first groove member 30. The protective sealant 22 and the first groove member 30 may clutch with each other. Under the function of the first surface 101, the cross-section of the first groove member 30 may actually be ⌐-shaped. That is, the first groove member 30 may be formed by the protective layer 22 and the first surface 101 of the flexible display substrate 10 with the ⌐-shape.

The display panel may include a first non-folding region NF1 and a folding region FF. The first protective layer 21 may be in the first non-folding region NF1 and the protective sealant 22 may be in the folding region FF.

Figure 9:
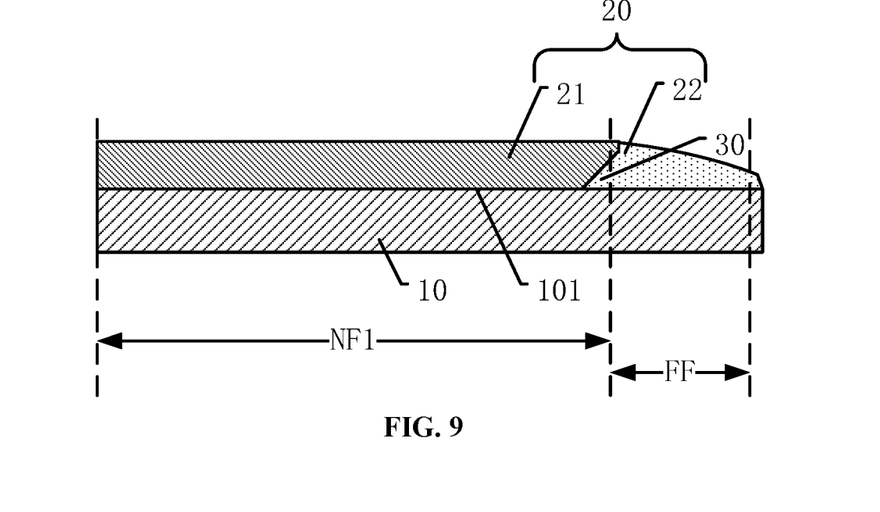
FIG. 9 illustrates another exemplary display panel consistent with various disclosed embodiments.

FIG. 9 illustrates another exemplary display panel consistent with various disclosed embodiments. As shown in FIG. 9, the display panel may include a flexible display substrate 10 and a protective member 20. The protective member 20 may cover a first surface 101 of the flexible display substrate 10.

The protective member 20 may include a first protective layer 21 and a protective sealant 22. A sidewall surface of the first protective layer 21 adjacent to the protective sealant 22 may have a first groove member 30. The protective sealant 22 and the first groove member 30 may clutch with each other. Under the function of the first surface 101 of the flexible display substrate 10, the cross-section of the first groove member 30 may actually be V-shaped. That is, the first groove member 30 may be formed by the protective layer 22 and the first surface 101 of the flexible display substrate 10 with the V-shape.

The display panel may include a first non-folding region NF1 and a folding region FF. The first protective layer 21 may be in the first non-folding region NF1 and the protective sealant 22 may be in the folding region FF.

The descriptions of the shapes of the cross-sections of the first groove member 30 illustrated in FIGS. 1-8 are for illustrative purposes only. It can be understood by those skilled in the art that the cross-section of the first groove member 30 may have a plurality of different shapes and will not repeated herein.

In some embodiments, the first groove member may be set in a continuous elongated shape. In particular, referring to FIG. 1 and FIG. 2, a length of the first groove member 30 is the same as a length of the sidewall surface of the first protective layer 21 adjacent to the protective sealant 22. That is, in the display panel illustrated in FIG. 2, the first groove member 30 may pass through the sidewall surface of the first protective layer 21 adjacent to the protective sealant 22. The length of the first groove member 30 is set longer, so that the contact area between the protective sealant 22 and the first protective layer 21 may be increased. Accordingly, the bonding strength between the protective sealant 22 and the first protective layer 21 may be increased. When the folding region FF of the display panel is folded, the separation between the first protective layer 21 and the protective sealant 22 under the action of stress may be prevented. Accordingly, the failure of the protective member 20 may be prevented; and the reliability of the display panel may be improved.

Figure 10:
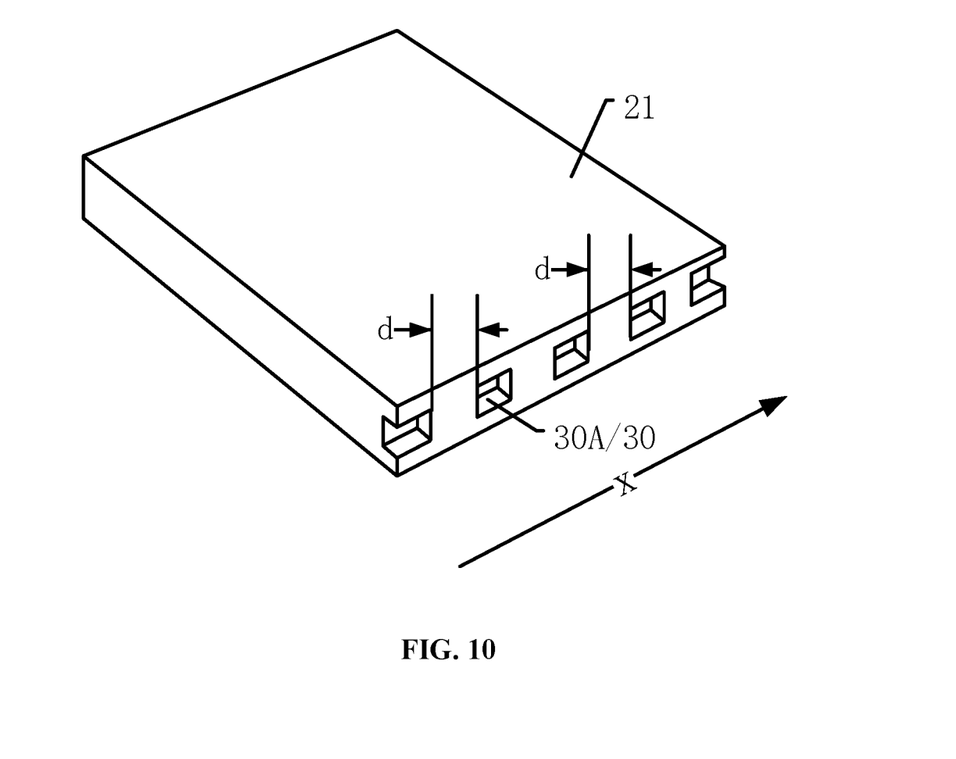
FIG. 10 illustrates a three-dimensional view of a first protective layer of another exemplary display panel in FIG. 1 consistent with various disclosed embodiments.

In other embodiments, the first groove member may be disposed in an intermittent shape. FIG. 10 illustrates a three-dimensional view of a first protective layer of another exemplary display panel consistent with various disclosed embodiments. Referring to FIG. 1 and FIG. 10, the first groove member 30 may include a plurality of first sub-groove members 30A. The plurality of first sub-groove members 30A may be arranged along the length (extending) direction of the sidewall surface the first protective layer 21 adjacent to the protective sealant 22.

In one embodiment, the length (extending) direction of the sidewall surface of the first protective layer 21 adjacent to the protective sealant 22 is the X-direction. The first groove member 30 may be disposed in an intermittent shape. The plurality of first sub-groove members 30A may be able to increase the contact area between the protective sealant 22 and the first protective layer 21. Thus, the bonding strength between the protective sealant 22 and the first protective layer 21 may be increased. When the folding region FF of the display panel is folded, the separation between the first protective layer 21 and the protective sealant 22 under the action of stress may be prevented. Accordingly, the failure of the protective member 20 may be prevented; and the reliability of the display panel may be improved.

Referring to FIG. 1 and FIG. 10, the distance "d" between any two adjacent first sub-groove members 30A may be equal. In particular, in one embodiment, the plurality of first sub-groove members 30A may be evenly distributed, and the distance "d" between two adjacent first sub-groove members 30A may be a constant value. Thus, in the different regions of the sidewall surface of the first protective layer 21 adjacent to the protective sealant 22, the protective sealant 22 may maintain an uniform clutching action with the first protective layer 21. Thus, the separation between the protective sealant 22 and the first protective layer 21 caused by the uneven distribution of the first sub-groove members 30A may be prevented. The uneven distribution of the first sub-groove members 30A may refer to that some of the first sub-groove members 30A may loosely distributed in some regions; and others of the first sub-groove members 30A may be intensely distributed in other regions.

When the first sub-grooves are unevenly distributed, the contact scales between the protective sealant 22 and the first protective layer 21 may be different in different regions. The protective sealant 22 and the first protective layer 21 in the regions having denser distribution of the first sub-grooves 30A may separate under the impact of stress. Accordingly, in the disclosed embodiments, because the plurality of first sub-groove members 30A may be evenly distributed, the separation between the protective sealant 22 and the first protective layer 21 may be prevented. When the folding region FF of the display panel is folded, the separation between the first protective layer 21 and the protective sealant 22 under the action of stress may be prevented. Accordingly, the failure of the protective member 20 may be prevented; and the reliability of the display panel may be improved.

Figure 11:
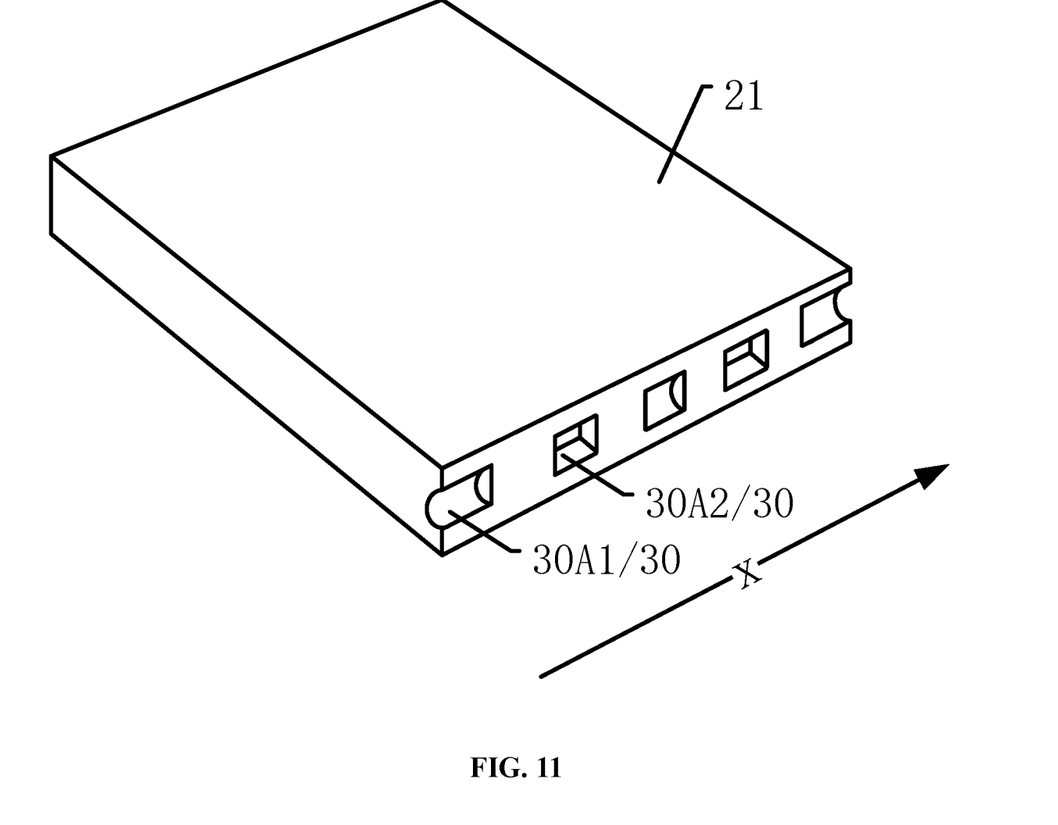
FIG. 11 illustrates a three-dimensional view of a first protective layer of another exemplary display panel in FIG. 1 consistent with various disclosed embodiments.

In some embodiments, the first groove member may be disposed in an intermittent pattern. That is, the first groove member may not be a continuous structure; and may include a plurality of sub groove members. FIG. 11 illustrates a three-dimensional view of a first protective layer of another exemplary display panel consistent with various disclosed embodiments. Referring to FIG. 1 and FIG. 11, the first groove member 30 may include a plurality of sub-groove members, such as a first sub-groove member 30A, a second groove member 30B . . . etc. The shapes of the plurality of first sub-groove members may not be all the same. The cross-section of the first sub-groove member 30A may be perpendicular to a distribution direction of the plurality of sub-groove members.

In one embodiment, the distribution direction of the first sub-groove members 30A is the X-direction. The cross-section of the first sub-groove member 30A may be any one of arc-shaped, V-shaped, ⊏-shaped, and zigzag-shaped, etc. The shapes of the plurality of the sub-grooves 30A may not all be the same. For example, as shown in FIG. 11, the cross-section of the first sub-groove member 30A1 may be arc-shaped, and the cross-section of the second sub-groove member 30A2 may be ⊏-shaped.

There may be many combinations of the shapes of the cross-sections of the plurality of first sub-groove portions 30A. The details are omitted herein.

Further, referring to FIG. 1 and FIG. 2, the first protective layer 21 may be made of at least one of polyvinylidene chloride, ethylene-vinyl alcohol copolymer, polyamide, polyester, and polyimide, etc.

In particular, polyvinylidene chloride is a kind of polymer material with desired flame resistance, corrosion resistance and air tightness, etc. Ethylene-vinyl alcohol copolymer has a tight molecular chain combination and exhibits excellent barrier ability. Polyamide is commonly known as nylon; and has a sufficient barrier performance. The most common and widely used materials in polyester are PET and PEN. Polyimide has a good thermal stability, high strength, high toughness, good insulation, good flame retardancy, non-toxic and non-polluting. Polyvinylidene chloride, ethylene-vinyl alcohol copolymer, polyamide, polyester, and polyimide may all have sufficient water vapor barrier and/or air resistance; and protect the flexible display substrate 10 from the erosion of moisture and/or air.

The first protective layer 21 may be made one of polyvinylidene chloride, ethylene-vinyl alcohol copolymer, polyamide, polyester, or polyimide. In some embodiments, the first protective layer 21 may be made of two or more than three of polyvinylidene chloride, ethylene-vinyl alcohol copolymer, polyamide, polyester, and polyimide. The material of the first protective layer 21 is not limited by the present disclosure.

In one embodiment, the first protective layer 21 may be a single layer structure. In some embodiments, the first protective layer 21 may be a multiple-layer structure. The number of layers the first protective layer 21 is not limited by the present disclosure.

In some embodiments, referring to FIG. 1 and FIG. 2, the first protective layer 21 may include at least one or more of a touch panel, a barrier film, and a polarizing film, etc. The specific structure of the first protective layer 21 is not limited by the present disclosure.

In one embodiment, the first protective layer 21 may include a touch panel. The touch panel may identify touch operations. In one embodiment, the touch panel may be plugged-in the first protective layer 21. The touch panel and the flexible display substrate 10 may be formed in different process flows; and then may be assembled together.

The operation mode of the touch panel can be self-capacitive mode or a mutual capacitive mode. The specific structure of the touch panel is not specifically limited in this embodiment.

The first protective layer 21 may also include a barrier film. The barrier film may block moisture and air from entering the flexible display panel; and thus to protect the flexible display panel from the erosion of moisture and air. The barrier film may be a single-layered film, or a composite film composed of a plurality of film layers. The layer structure of the barrier film is not specifically limited by the present disclosure. The barrier film may be made of metal oxide, metal carbide, metal nitride, or metal oxynitride, etc. The material of the barrier film is not specifically limited by the present disclosure.

The first protective layer 21 may also include a polarizing film. The basic structure of the polarizing film may include a polyvinyl alcohol (PVA) film in the middle, two layers of triacetate (TAC) films, pressure sensitive adhesive (PSA) films, release films and protective layers, etc. Among of these films, the PVA film plays a role in polarization, but PVA is easily hydrolyzed. To protect the physical properties of the polarizing film, a TAC film may be laminated on each side of the PVA film. The TAC film may have a substantially high light transmittance, good water resistance and certain mechanical strength; and may be used to protect the PVA film. Accordingly, the original film of the polarizing film may be formed. In practical applications, it may be necessary to set the polarizing film according to different requirements of the display panel. For example, a phase difference film with a positioning phase difference compensation value and a protective layer may be combined according to a certain compensation angle.

The first protective layer 21 may include one of the touch panel, the barrier film, and the polarizing film. In some embodiments, the first protective layer 21 may include two of the touch panel, the barrier film, and the polarizing film. In other embodiments, the first protective layer 21 may include the touch panel, the barrier film, and the polarizing film.

The number of layers of the film structure having the protective function in the present disclosed display panel may be substantially large, the specific material or structure of the first protective layer may not be further described herein. It can be understood by those skilled in the art that the film layer covering the surface of the flexible display substrate and having the protective function and including the first groove member on the sidewall surface close to the protective sealant may be configured as the first protective layer.

In some embodiments, referring to FIG. 1 and FIG. 2, the protective sealant 22 may include a UV-curable adhesive. The UV curable-adhesive, also known as ultraviolet light curable adhesive, is a one-component, and solvent-free adhesive. The UV curable adhesive and visible light-curable adhesive or sealant have the advantages of fast curing, low energy consumption, and no solvent pollution, etc.; and are new energy-saving and environmentally-friendly adhesive that have been applied to electronic components and daily life. The so-called UV curable refers to that the photoinitiator in the adhesive is rapidly decomposed into radicals or cations under the irradiation of ultraviolet light of appropriate wavelength and light intensity; and thereby initiating polymerization of unsaturated bonds to solidify the material.

Figure 12:
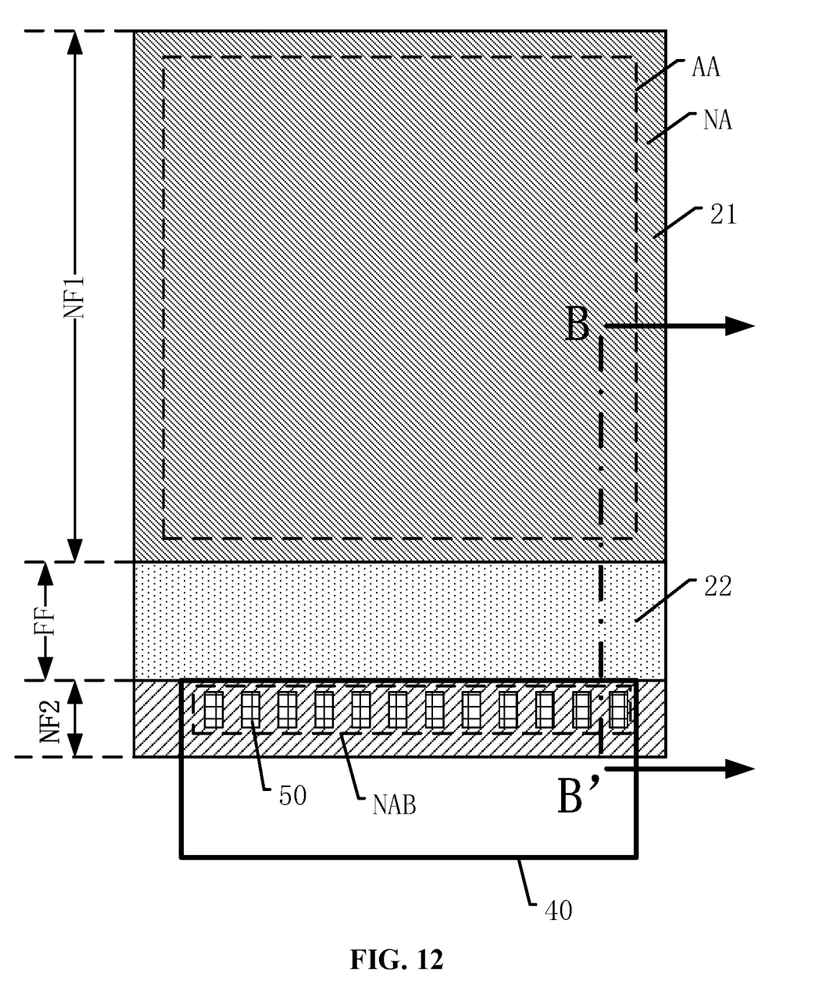
FIG. 12 illustrates another exemplary display panel consistent with various disclosed embodiments.
Figure 13:
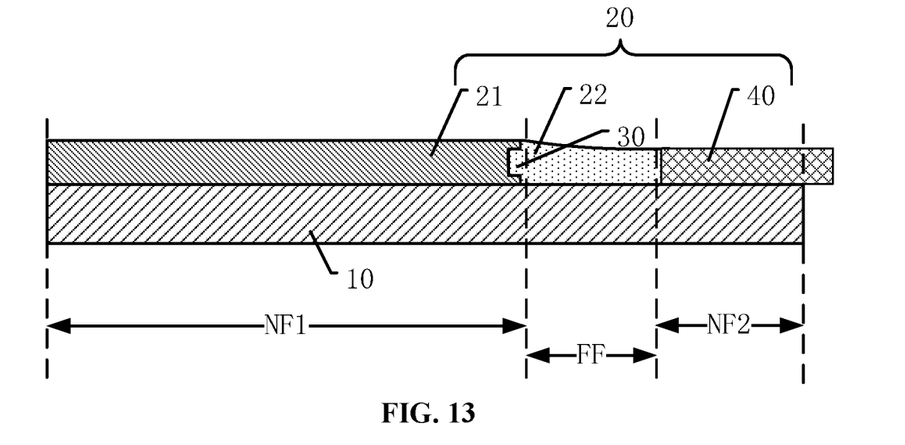
FIG. 13 illustrates a BB'-line view of an exemplary display panel in FIG. 12 consistent with various disclosed embodiments.

FIGS. 12-13 illustrate another exemplary display panel consistent with various disclosed embodiments. FIG. 13 is BB-sectional view of a display panel in FIG. 12. As shown in FIGS. 12-13, the display panel may include a flexible display substrate 10 and a protective member 20. The protective member 20 may cover the flexible display substrate 10.

The protective member 20 may include a first protective layer 21 and a protective sealant 22. A sidewall surface of the first protective layer 21 adjacent to the protective sealant 22 may have a first groove member 30. The protective sealant 22 and the first groove member 30 may clutch with each other. Further, the protective member 20 may include a flexible circuit board 40.

The display panel may include a first non-folding region NF1, a folding region FF and a second non-folding region NF2. The flexible circuit board 40 may be disposed in the second non-folding region NF2. In one embodiment, the flexible circuit board 40 may be on the surface of the flexible substrate 10. The flexible circuit board 40 may transmit electrical signals for the flexible display substrate 10.

In particular, the flexible circuit board 40, also called "soft board", may be a printed circuit board made of a flexible insulating material. The flexible circuit board 40 may provide an excellent electrical performance to meet the design needs of smaller and higher density installations, as well as reduce assembly processes and increase reliability. The flexible circuit board 40 may be the only solution to meet the miniaturization and movement requirements of electronic products. The flexible circuit board 40 may be bent, wound, and folded freely, and may be able to withstand millions of dynamic bending without damaging the wires. Further, the flexible circuit board 40 may be arranged arbitrarily according to the spatial layout requirements and may be arbitrarily moved and expanded in the three-dimensional space to achieve the integration of component assembly and wire connections. Further, the flexible circuit board 40 may greatly reduce the size and weight of electronic products, and suitable for the development of electronic products in the direction of high density, miniaturization and high reliability.

Referring to FIG. 12, to clearly illustrate the technical solution of the present embodiment, the flexible circuit board 40 is not illustrated with pattern filling, and but only indicated by a line frame.

Further, referring to FIG. 12 and FIG. 13, the display panel may include a display area AA and a peripheral non-display area NA. The display area AA may be disposed in the first non-bending region NF1. The folding region FF may be disposed in the non-display area NA. In one embodiment, the display panel in the display area AA may not be bended or folded and the flat panel state may be maintained. The display panel in the non-display area NA can be bended and folded. For example, the display panel in the non-display area NA may be folded to the back of the display panel; and the display panel may have a narrow border effect.

Further, referring to FIG. 12 and FIG. 13, in some embodiments, the non-display arear AA may include a bonding area NAB. The bonding area NAB may include a plurality of soldering pads 50. The bonding area NAB may be disposed in the non-folding region NF2.

In one embodiment, the bonding area NAB may be used to bond the flexible circuit board 40 or the chip. The plurality of soldering pads 50 in the bonding area NAB may be electrically connected to the bonded flexible circuit board or the chip. Because the bonding area NAB may be used to bond the flexible circuit board 40 or the chip, the bonding area NAB may be disposed in the second non-folding region NF2. Such a configuration may prevent a failure of electrical connections in the flexible circuit board 40 or the chip caused by the bending or folding of the display panel in the bonding area NAB. Thus, the reliability of the display panel may be improved.

Figure 14:
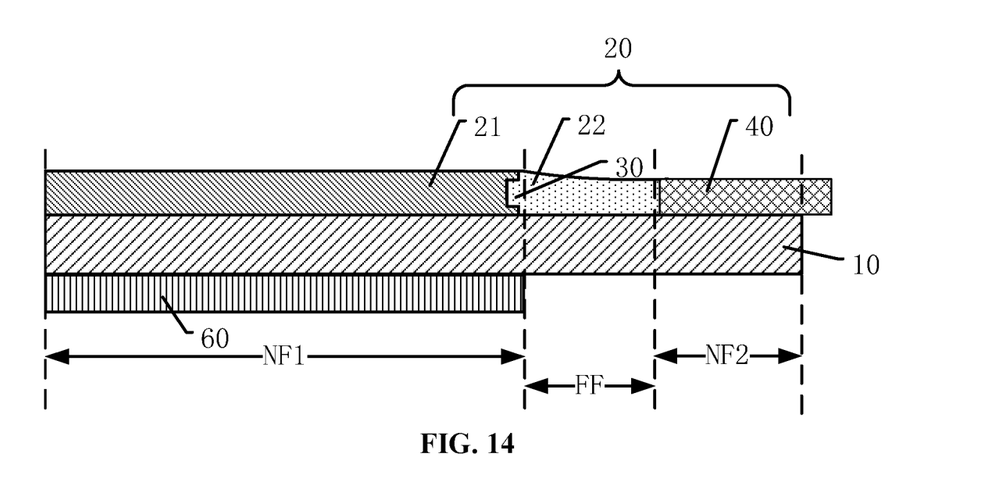
FIG. 14 illustrates another BB'-line view of an exemplary display panel in FIG. 12 consistent with various disclosed embodiments.
Figure 15:
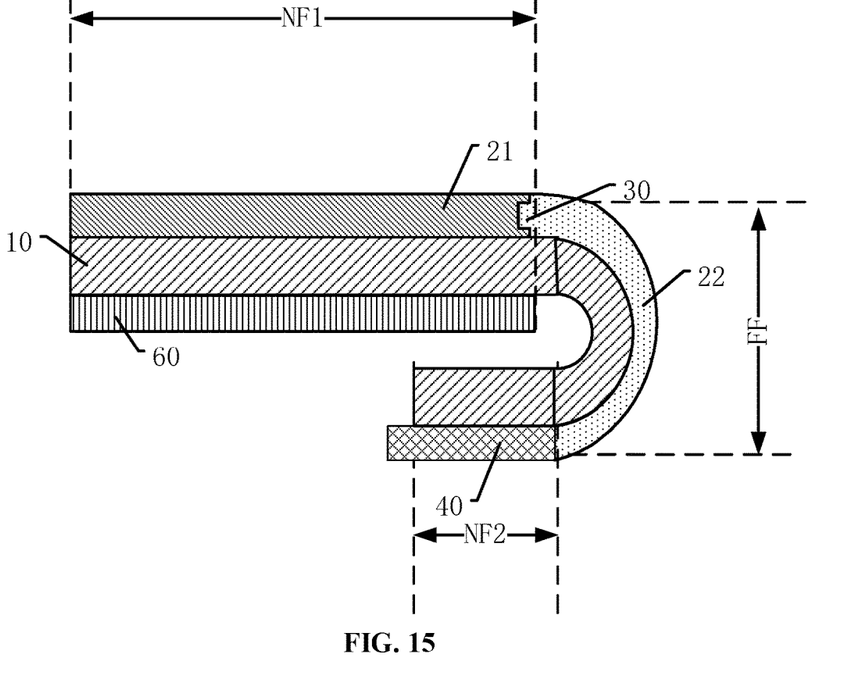
FIG. 15 illustrates an exemplary display panel in FIG. 14 at the folded state consistent with various disclosed embodiments.

FIG. 15 illustrates an exemplary display panel in FIG. 14 at the folded state consistent with various disclosed embodiments. As shown in FIG. 15, the folding region FF of the display panel may be folded; and the display panel in the second non-folding region NF2 may be bent to the back surface of the display panel. Thus, the technical effect of the narrow frame may be achieved.

FIG. 14 is a BB-sectional view of an exemplary display panel in FIG. 12. As shown FIG. 12 and FIG. 14, the display panel may include a flexible display substrate 10 and a protective member 20. The protective member 20 may cover the flexible display substrate 10.

The protective member 20 may include a first protective layer 21 and a protective sealant 22. A sidewall surface of the first protective layer 21 adjacent to the protective sealant 22 may have a first groove member 30. The protective sealant 22 and the first protective layer 21 may clutch with each other. Further, the protective member 20 may include a flexible circuit board 40.

The display panel may include a first non-folding region NF1, a folding region FF and a second non-folding region NF2. The flexible circuit board 40 may be in the second non-folding region NF2. In one embodiment, the flexible circuit board 40 may be on the surface of the flexible substrate 10. The flexible circuit board 40 may transmit electrical signals for the flexible display substrate 10.

Further, the display panel may include a bottom protective layer 60. The bottom protective layer 60 may be disposed on the surface of the flexible display substrate 10 away from the protective member 20.

In one embodiment, the bottom protective layer 60 may support and protect the flexible display substrate 10. For example, the bottom protective layer 60 may possess a certain rigidity and toughness and may protect the flexible display substrate 10 when the display panel is subjected to an external force. The bottom protective layer 60 may also play a certain supporting role on the flexible display substrate 10 to prevent the deformation of the flexible display substrate 10. For example, the bottom protective layer 60 may be used to adjust the neutral surface of the display panel near the display function layer when the display panel is folded. Further, the bottom protective layer 60 may be able to block air; and protect the flexible display substrate 10 from the erosion of moisture and oxygen and prevent impurities from entering the flexible display substrate 10. The bottom protective layer 60 may have one or more of the functions described above, or may have other functions, which are not limited by the present disclosure.

In one embodiment, the bottom protective layer 60 may be disposed in the first non-folding region NF1. The bottom protective layer 60 may not be disposed in the folding region FF to avoid affecting the folding property of the folding region FF. In some embodiments, the bottom protective layer 60 may also be disposed in the second non-folding region NF2 (not shown). The location where the bottom protective layer 60 is disposed is not limited by the present disclosure.

Figure 16:
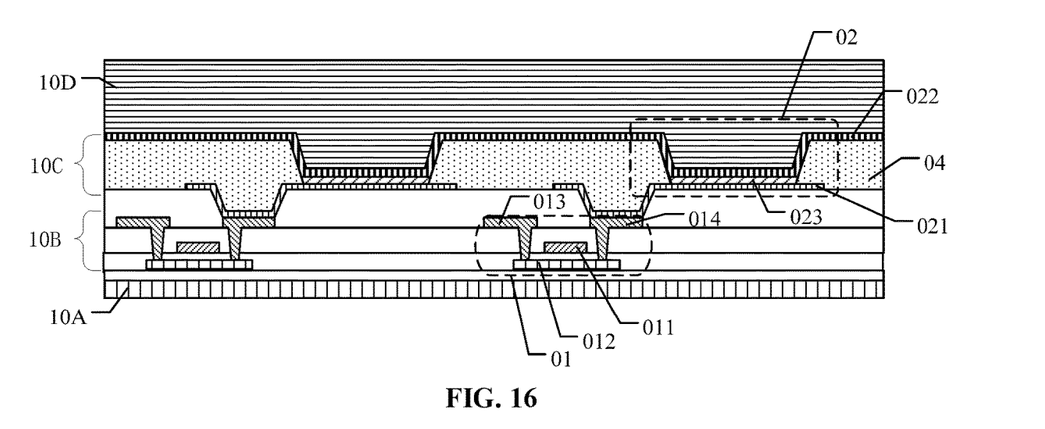
FIG. 16 illustrates a flexible substrate of another exemplary display panel consistent with various disclosed embodiments.

FIG. 16 illustrates an exemplary flexible display substrate of a display panel consistent with various disclosed embodiments. As shown in FIG. 16, the flexible display substrate 10 may include a flexible substrate 10A, and a driving device layer 10B, a light-emitting device layer 10C, and an encapsulation layer 10D, which are sequentially disposed on the flexible substrate 10A.

The flexible display substrate 10A may be made of any appropriate material, such as polyimide, etc. The driving device layer 10B may include a plurality of thin film transistors (TFTs) 01. The thin film transistor 01 may include a gate electrode 011, an active layer 012, a source electrode 013, and a drain electrode 014. The light-emitting device layer 10C may include a plurality of organic light-emitting diodes (OLEDs) 02. The organic light-emitting diode 02 may include an anode 021, a cathode 022, and a light-emitting material layer 023 sandwiched between the anode 021 and the cathode 022. The encapsulation layer 10D may be a thin film encapsulation layer. The thin film encapsulation layer may have a good function of blocking moisture and air; and may be able to protect the flexible display substrate 10 from the erosion of moisture and air.

The present disclosure also provides a display apparatus. The display apparatus may include the disclosed display panel and/or other appropriate display panel.

Figure 17:
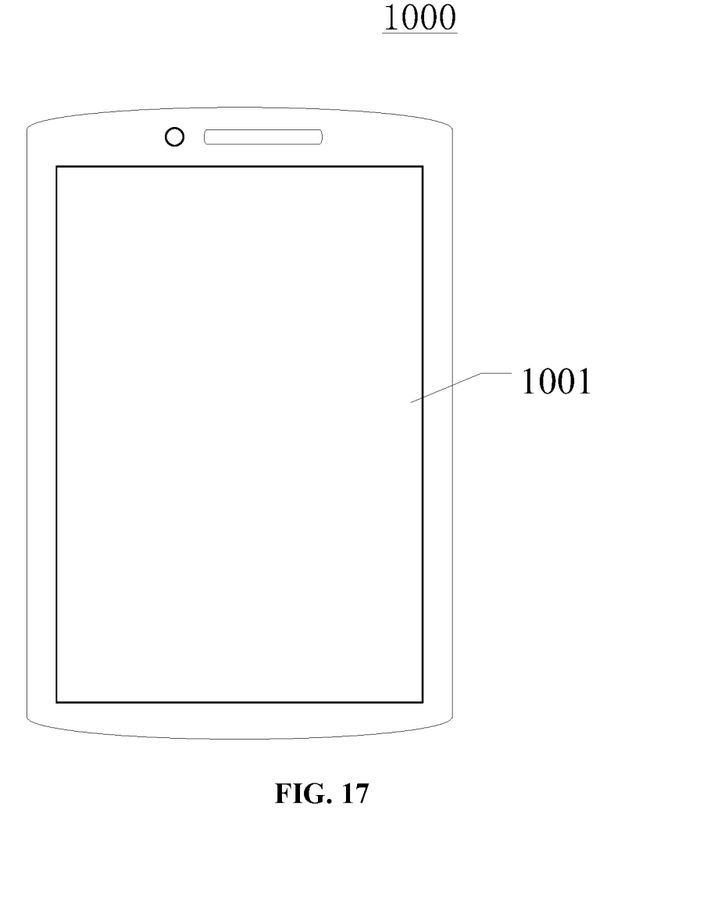
FIG. 17 illustrates an exemplary display apparatus consistent with the various disclosed embodiments.

FIG. 17 illustrates an exemplary display apparatus consistent with various disclosed embodiments. As shown in FIG. 17, a display apparatus 1000 is provided. The display panel 1000 may include a display panel 1001. The display panel 1001 may be any one of the display panels provided by the above embodiments of the present disclosure or other appropriate display panel.

In one embodiment, for illustrative purposes, a cell phone is illustrated in FIG. 17 for describing the display apparatus 1000. In some embodiments, the display apparatus may be other display apparatus having the display function, such as, a computer, a television, a tablet computer, an on-board display apparatus, or a virtual reality apparatus, etc. The specific display apparatus is not limited by the present disclosure.

The display apparatus provided by the present disclosure may have the beneficial effects of the disclosed display panels. The details may be referred to the detailed descriptions of the disclosed display panels, and the details are omitted herein.

The disclosed display panels and display apparatus may have at least the following beneficial effects. A first groove member may be formed on a sidewall surface of the first protective layer adjacent to the protective sealant; and the protective sealant material may flow into the first groove member due to its own fluidity during the coating process, and may clutch with the first groove member. The first groove member may be able to increase the contact area between the protective sealant and the first protective layer. Thus, the bonding between the protective sealant and the first protective layer may be increased. When the folding region of the display panel is folded, the separation at the position where the first protective layer and the protective adhesive are connected under the action of stress may be prevented; the failure of the protective member may be prevented; and the reliability of the display panel may be improved.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A display panel, comprising:
    a flexible display substrate; and
    a protective member covering a surface of the flexible display substrate,
    wherein:
    the protective member includes a first protective layer and a protective sealant;
    a sidewall surface of the first protective layer adjacent to the protective sealant includes at least one first groove member, wherein the at least one first groove member includes a plurality of first sub-groove members arranged in merely one row along a length direction of the sidewall surface of the first protective layer adjacent to the protective sealant, and the plurality of first sub-groove members include arc-shaped first sub-groove members and ⊏-shaped first sub-groove members that are alternatively arranged along the length direction of the sidewall surface;
    the protective sealant and the at least one first groove member clutch with each other;
    the display panel includes a first non-folding region and a folding region;
    the first protective layer is disposed in the first non-folding region; and
    the protective sealant is disposed in the folding region.
2. The display panel according to claim 1, wherein:
    a length of the at least one first groove member is equal to a length of the sidewall surface of the first protective member adjacent to the protective sealant.
3. The display panel according to claim 1, wherein:
    distances between any two adjacent first sub-groove members are equal.
4. The display panel according to claim 1, wherein:
    cross-sections of the plurality of first sub-groove members are perpendicular to a direction along which the plurality of first sub-groove members are arranged.
5. The display panel according to claim 1, wherein:
    the first protective layer is made of at least one of polyvinylidene chloride, ethylene-vinyl alcohol copolymer, polyamide, and polyester.
6. The display panel according to claim 1, wherein the first protective layer comprises at least one of:
    a touch panel;
    a barrier film; and
    a polarizing film.
7. The display panel according to claim 1, wherein:
    the protective sealant is made of an ultraviolet (UV) curable adhesive.
8. The display panel according to claim 1, wherein the protective member further comprises:
    a flexible circuit board.
9. The display panel according to claim 8, further comprising:
    a second non-folding region,
    wherein the flexible circuit board is disposed in the second non-folding region.
10. The display panel according to claim 9, further comprising:
    a display region and a peripheral non-display region,
    wherein:
    the display region is disposed in the first non-folding region; and
    the folding region is disposed in the non-display region.
11. The display panel according to claim 10, wherein the non-display region comprises:
    a bonding region,
    wherein:
    the bonding region includes a plurality of conductive soldering pads; and
    the bonding region is disposed in the second non-folding region.
12. The display panel according to claim 1, further comprising:
    a bottom protective layer disposed on a side of the flexible substrate away from the protective member.
13. A display apparatus, comprising:
    a display panel,
    wherein the display panel comprises:
    a flexible display substrate; and
    a protective member covering a surface of the flexible display substrate,
    wherein:
    the protective member includes a first protective layer and a protective sealant;
    a sidewall surface of the first protective layer adjacent to the protective sealant includes at least one first groove member, wherein the at least one first groove member includes a plurality of first sub-groove members arranged in merely one row along a length direction of the sidewall surface of the first protective layer adjacent to the protective sealant, and the plurality of first sub-groove members include arc-shaped first sub-groove members and ⊏-shaped first sub-groove members that are alternatively arranged along the length direction of the sidewall surface;
    the protective sealant and the at least one first groove member clutch with each other;
    the display panel includes a first non-folding region and a folding region;
    the first protective layer is disposed in the first non-folding region; and
    the protective sealant is disposed in the folding region.
14. The display apparatus according to claim 13, wherein:
    a length of the at least one first groove member is equal to a length of the sidewall surface of the first protective member adjacent to the protective sealant.

15. The display apparatus according to claim 13, wherein:
distances between any two adjacent first sub-groove members are equal.

16. The display apparatus according to claim 13, wherein:
cross-sections of the plurality of first sub-groove members are perpendicular to a direction along which the plurality of first sub-groove members are arranged.

\* \* \* \* \*